United States Patent [19]
Sidor

[11] 3,958,202
[45] May 18, 1976

[54] POSITIONAL TRANSDUCER UTILIZING MAGNETIC ELEMENTS HAVING IMPROVED OPERATING CHARACTERISTICS

[75] Inventor: Edward F. Sidor, Lombard, Ill.
[73] Assignee: Illinois Tool Works Inc., Chicago, Ill.
[22] Filed: Nov. 18, 1974
[21] Appl. No.: 524,608

[52] U.S. Cl. .............................. 336/110; 336/132; 340/197; 340/174 PM; 340/174 VC
[51] Int. Cl.² ................... G08C 19/06; H01F 21/06
[58] Field of Search ............... 336/110, 132, 130; 340/197, 174 PM, 174 VC, 365 L

[56] References Cited
UNITED STATES PATENTS

| | | | |
|---|---|---|---|
| 3,638,221 | 1/1972 | Bernin | 340/365 L |
| 3,638,222 | 1/1972 | Bernin | 340/365 L |
| 3,698,531 | 10/1972 | Bernin | 336/110 X |

*Primary Examiner*—Thomas J. Kozma
*Attorney, Agent, or Firm*—Glenn W. Bowen; Robert W. Beart

[57] ABSTRACT

A positional transducer is disclosed which utilizes an elongated, hollow element of a magnetically saturable material which has at least one elongated, cylindrical passageway running through it. Two, or alternately, four, sense wires are associated with the device and are interconnected so as to form a sensing circuit, such as an inductance bridge network, for example. A pair of elongated, generally rectangular-shaped magnets of opposite polarities are positioned adjacent the exterior surface of the magnetic element at diametrically opposite locations. The position of the magnets, with respect to the magnetic element, determines the amount of magnetic saturation of the tube and the output indication from the sensing circuit.

10 Claims, 8 Drawing Figures

POSITIONAL TRANSDUCER UTILIZING MAGNETIC ELEMENTS HAVING IMPROVED OPERATING CHARACTERISTICS

BACKGROUND OF THE INVENTION

The present invention relates to a positional sensing transducer which utilizes at least one elongated tube constructed of a magnetically saturable material. One or more sense wires run through each tube parallel to the elongated axis of the tube, and a pair of oppositely poled magnets are positioned on diametrically opposite, exterior portions of the tube so that the magnetic flux from the magnets will completely saturate the portion of the tube that lies between the magnets; while the remaining portion of the tube remains unsaturated.

The use of a ferrite element that is of a toroidal shape and is positioned between two saturating magnets to produce an output signal on a sense line that runs through the core is disclosed in U.S. Pat. No. 3,638,221, issued in the name of Victor M. Bernin on Jan. 25, 1972, and assigned to the assignee of the present invention. The apparatus of the Bernin patent is a keyboard switch in which the entire toroidal core is completely saturated when the magnets are lowered on a keystem into the vicinity of the cores. In order to accomplish the purposes of the Bernin patent, the core of the switch of that patent is positioned so that its axis is parallel to the wide part of the magnets, which are of a substantially greater dimension than is the thickness of the core.

The present invention, by contrast, uses at least one hollow, elongated, cylindrical tube constructed of a material which is magnetically saturable, one or more sense wires that run through the tube and two oppositely polled magnets that move adjacent the outside of the tube in order to provide an accurate linear indication of the position of the magnets with respect to the tube. In other words, the present invention does not provide a binary 1 or 0 output signal; but instead, it may be used to accurately determine the position of the saturating magnets with respect to each tube. The portion of each elongated tube that lies between the magnets is saturated while the remaining portions are not. Because each of the tubes provides a closed flux path, there is no substantial fringing effect at the ends of the saturating magnets; and, therefore, the portion of the tube that is not between the magnets remains substantially unsaturated.

Since the output signal that is provided on the sense wires that run through the tube is primarily dependent upon the position of the magnets with respect to the tube, a very linear output signal is achieved. In addition, problems that generally affect magnetic sensors that depend on partial saturation of the sensing element, such as temperature and aging, are also substantially eliminated. Moreover, the magnetic force that is required to operate the sensing device of the present invention is not critical because of the reliance on complete saturation of the portion of the tube that lies between the magnets to produce an output signal. This is in direct contrast to sensing devices such as those shown in the McAdam U.S. Pat. No. 2,915,637 in which a partial magnetic saturation of the entire toroidal core is employed to provide an output signal.

A prior co-pending United States patent application Ser. No. 518,310, now abandoned, entitled . . . "Positional Transducer Utilizing Magnetic Elements," was filed on . . . Oct. 29, 1974, in the name of Victor M. Bernin and is assigned to the assignee of the present invention. This prior application was directed to a positional transducer that utilized a magnetically saturated, cylindrical, hollow tube in which a single sense wire ran through the passageway in the tube; and the position of a pair of elongated magnets, with respect to the tube, controlled the degree of saturation of the tube so as to provide an output signal indicative of the relative position of the tube and the magnets. The positional transducer of the prior Bernin application was designed so that it could be connected in series with a second separate transducer element of the same type in order to form a sensing circuit, such as an inductive potentiometer or two legs of a two-arm active inductance bridge network.

The present invention is an improvement over the transducer disclosed in the aforementioned Bernin application. In particular, an improved sensing device may be obtained with the present invention since a single unitary magnetic element may be used, thereby substantially eliminating the temperature aging affects that would result if two separate magnetic elements were employed. With the present invention, a two-arm active inductance bridge or four-arm active inductance bridge may be constructed; and the sensitivity of the four-arm active bridge will be approximately two times that of the two-arm active bridge.

DESCRIPTION OF THE DRAWINGS

The present invention is illustrated by reference to the drawings in which.

TECHNICAL DESCRIPTION OF THE INVENTION

Figure 1:
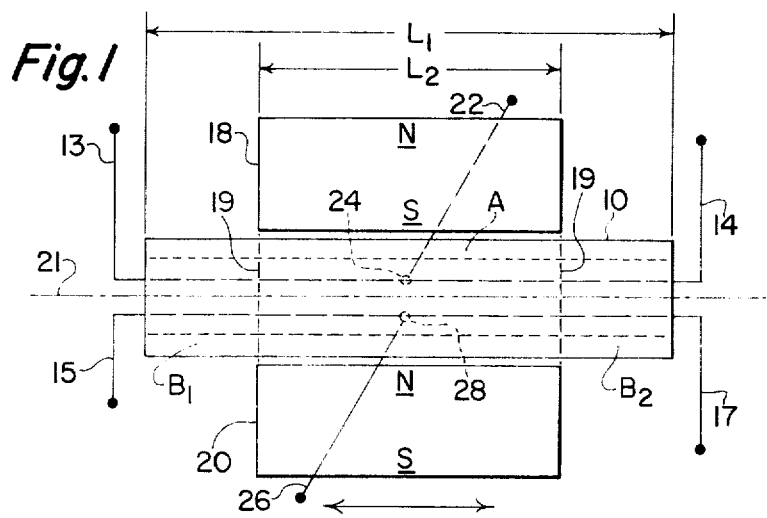
FIG. 1 is a top view of one embodiment of the present invention which utilizes a single elongated hollow tube.

The positional transducers of the present invention are highly linear, contactless, very accurate and reliable, capable of functioning in severe environments and are relatively low in cost. The manner in which one embodiment of the linear transducer of the present invention is constructed, as shown in FIG. 1, in which an elongated, hollow tube 10, which may be constructed of a ferrite or other suitable material and which is capable of being magnetically saturated, is employed as a unitary magnetic element. By use of a cylindrical hollow tube 10, a closed magnetic flux path is provided to the wall 16 of the tube 10. This reduces the drive requirement and substantially eliminates fringing effects thereby improving the sensitivity of the transducer. The transducer may be constructed with either one pair or two pairs of the sense wires. If a single pair of sense wires is employed and a drive wire is not utilized with the tube 10, these may be connected into a two-arm active inductance bridge network. If the drive wire is utilized, the pair of sense windings may be utilized to form a transformer output. If both pair of sense wires are employed, they may be interconnected so as to form the four-arm active bridge network shown in FIG. 3.

In the embodiment of FIG. 1, one pair of sense wires 13,14 are connected together at their inner ends, where they connect to a lead 22 which passes through an aperture 24 in the wall 16 of the tube 10. The other pair of sense wires 15,17 are connected together at their inner ends where they connect to a lead 26 which passes through an aperture 28 in the wall 16. The windings 13,14, 15,17 run into the tube 10 in a direction generally parallel to the elongated axis 21 of the tube 10. Thus, either the windings 13,14 or the windings 15,17 may be connected so as to form a two-branch sensing circuit; or, alternately, they may be interconnected to form the four-arm active inductive bridge network of FIG. 3.

Figure 3:
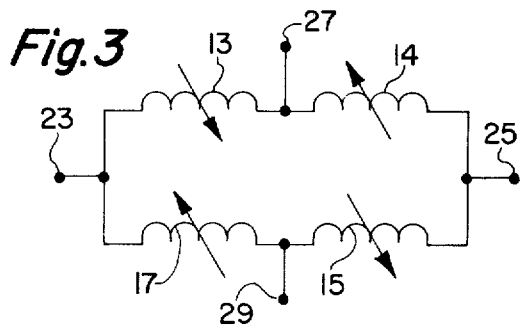
FIG. 3 is a circuit schematic of a four-arm active inductance bridge network that may be constructed in accordance with the present invention.

In the four-arm active inductive bridge circuit of FIG. 3, the input voltage may be impressed across one pair of terminals, such as the terminals 23,25; and the output voltage may be supplied across the other pair of terminals, such as the terminals 27,29. If only one pair of sense wires, such as the pair of wires 13,14 or the pair of wires 15,17, are employed, resistors or other impedance elements may be used to replace the other pair of sense wires in the circuit of FIG. 3 to form a two-arm active inductance bridge network.

The output signal from the transducer of FIG. 1 is controlled by the position of the magnets 18,20 with respect to the tube 10. The magnets 18,20 move to the left and to the right, as shown in FIG. 1, in a direction substantially parallel to the elongated axis 21 of the tube 10. The actual length of the tube 10 of FIG. 1 is dependent upon the accuracy of sensing that is desired. In general, however, the elongated dimension $L_1$ of the tube will be on the order of at least ten times the thickness of conventional toroidal cores that are commercially available for magnet memory core applications; but the elongated dimension $L_1$ of the tube 10 will generally be over one-half inch if relatively accurate sensing is required. The elongated dimension $L_2$ of the magnets 18,20 is preferably slightly shorter than the length $L_1$. The longer the tube, the better the displacement resolution of the sensing device becomes.

The relative position of a pair of magnets 18,20 which are oppositely poled and are positioned adjacent the exterior of the periphery of the wall 16 determines the output signal that appears in the sense wires. As the magnets 18,20 travel from the left and the right, as viewed in FIG. 1, they will saturate different volumes of the tube 10. In the position shown in FIG. 1, the portion A of the tube 10 between the magnets 18,20 will be substantially saturated; while the portions $B_1$ and $B_2$ outside of the magnets 18, 20 will be substantially unsaturated. Although there will be some degree of saturation in the vicinity of the boundary line 22 between portion A and the portions $B_1$ and $B_2$, this will be very small because of the close proximity of the magnets 18,20 to each other and because of the closed magnetic flux path provided by the wall 16.

As the magnets 18,20 move to the left or the right over the tube, a different amount of the volume of the tube intermediate the magnets 18,20 is magnetically saturated, with respect to the sense wires 13,14 or to the sense wires 15,17, so as to give an indication on these sense lines of the relative position of the tube 10 with respect to the magnets 18,20. Since each portion of the tube 10 is either completely saturated or is substantially nonsaturated, and since all of the sense lines are associated with a unitary magnetic element in the present invention, the device is virtually free from temperature and aging variation and it does not require a critical magnetic force, as would be the case if the entire structure of the tube 10 were partially magnetically saturated by the magnets 18,20. Thus, the tube 10 can be saturated incrementally with a high degree of magnetic resolution and control. To achieve this result, there is a high ratio of the length $L_1$ of the tube 10 to its diameter $d$ whereby the small air gap between the magnets 18,20 and the wall 16 results in a more confined and controllable flux configuration so that the transducer is not flux density sensitive. The tube 10 may be extruded resulting in a high uniformity of cross-sectional area which contributes to transducer accuracy.

Figure 2:
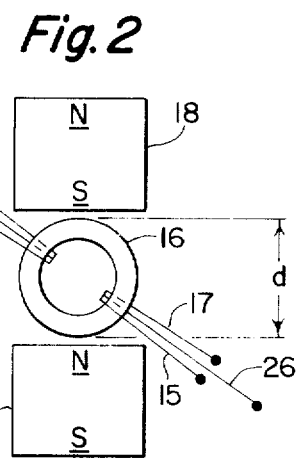
FIG. 2 is an end view of the embodiment of FIG. 1.
Figure 4:
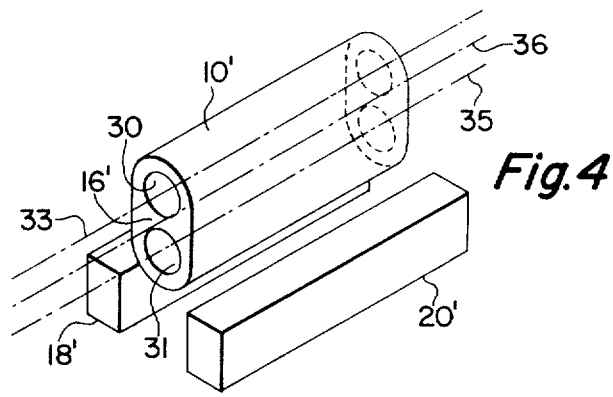
FIG. 4 is a perspective view of a second embodiment of the present invention.
Figure 6:
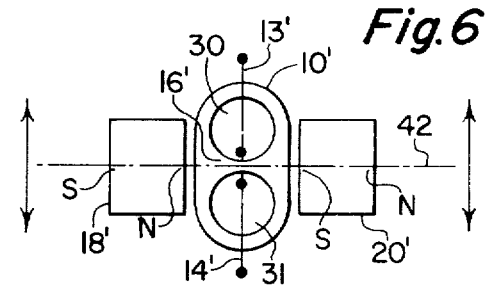
FIG. 6 is an end view of the embodiment of FIG. 5.
Figure 8:
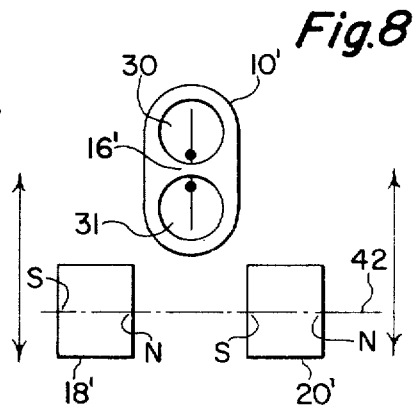
FIG. 8 is an end view of the embodiment of FIG. 7.

FIG. 4 shows another embodiment of the present invention. This version differs from the version of FIGS. 1 and 2 in that instead of a single elongated, hollow, cylindrical tube, the unitary magnetic element 10' is formed with two cylindrical tubes 30,31 that are connected together by the common wall 16'. Another difference is that the magnets 18',20' do not move back and forth along the central axis 36 of the unitary magnetic element 10'; but, instead, they move up and down, as shown in FIGS. 6 and 8. The same electrical interconnection may be made, however, to form a two-arm active inductance bridge network or a four-arm active bridge inductance network. A transformer may also be formed by the addition of a drive line.

Figure 5:
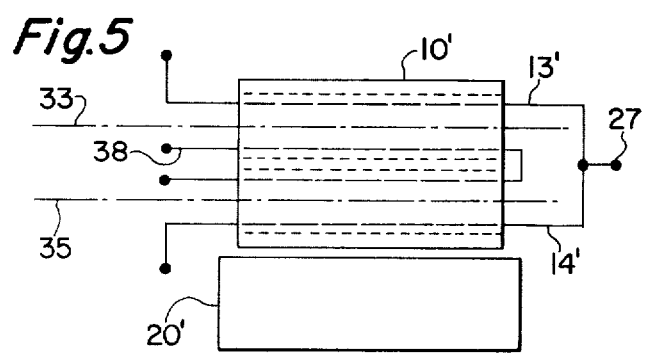
FIG. 5 is a side view of a embodiment constructed in accordance with FIG. 4 in which two sense wires are employed.

FIG. 5 shows a side view utilizing an embodiment of a two-arm active bridge network element utilizing the element 10' of FIG. 4. If a two-arm active inductance bridge network is to be constructed, the element 10' of FIG. 4 may have a pair of sense lines 13',14' running through the elongated, cylindrical passageways or tubes 30,31 in a direction generally parallel to the elongated axis 33 of the tube 30 and the axis 35 of the tube 31, respectively, so that they may be interconnected at the terminal 27. Motion of the magnets 18',20' up and down, as indicated by the arrow in FIG. 6, causes a change in the inductance of the sense line 13' with respect to the inductance of the sense line 14'. The centerline 42' of the magnets 18',20' may be moved from below the element 10', such as the position shown in FIG. 8, to the position shown in FIG. 6 so that the centerline 42' lies substantially in the same plane as the elongated axis 36 of the element 10'. The inductance of the sense wires 13' ,14' will be substantially equal at the position shown in FIG. 6; and as the magnets 18',20' move away from this position toward the position shown in FIG. 8, the inductance of one wire, with respect to the other, will vary differentially with respect to the other, thereby providing an indication of the relative position of the magnets 18',20' with respect to the element 10'.

Figure 7:
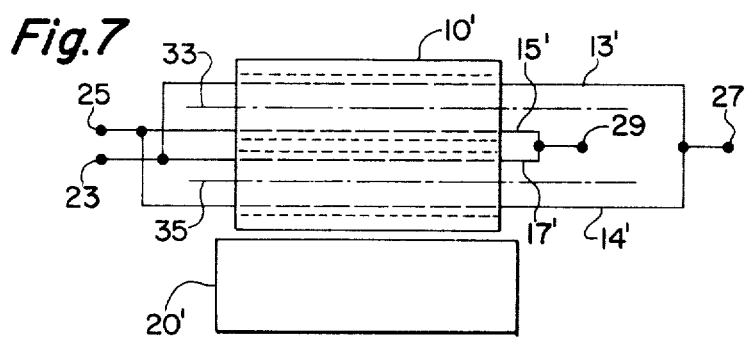
FIG. 7 is a side view of the embodiment constructed in accordance with FIG. 4 in which four sense wires are employed.

A four-arm active bridge inductance network utilizing the element 10' of FIG. 4 is shown in FIG. 7 in which the sense windings 15',17' are interconnected at the terminal 29, and the sense wires 13',14' are connected together at the terminal 27. An end version showing of the four-arm active bridge embodiment of FIG. 7 is shown in FIG. 8. A still further embodiment may be implemented by adding a drive line 38 to the two sense wire version of FIG. 5 to provide transformer coupling between the drive line 38 and the sense lines 13',14', thereby providing a transformer, if desired.

The four-arm active inductive bridge network of the present invention is advantageous over the device disclosed in the co-pending Bernin application in that it has a sensitivity which is approximately two times greater than that of the device of the Bernin application, which utilized two separate linear cores. In addition to the improved sensitivity, the temperature range of operation of the device is substantially improved since all of the sense winding means are associated with a single unitary magnetic element so that the affect of temperature and aging will be substantially nullified since the inductance of both sense wires will vary in a general manner.

The foregoing description contains a limited number of embodiments of the present invention. It will be understood, however, that such embodiments are only illustrative and that numerous variations are possible without departing from the scope of the invention as defined in the claims.

The invention is claimed as follows:

1. A sensing device comprising an elongated, hollow tube constructed of a material which is magnetically saturable, said tube having a longitudinal axis, an aperture in said tube, a pair of sense wires that run in a direction generally parallel to the longitudinal axis of said tube with one end of each sense wire being interconnected within said tube, an electrical lead connected to the interconnected ends of said sense wires that passes through said aperture and elongated permanent magnet means constructed to completely magnetically saturate a portion of said tube which is disposed adjacent said magnet means and to be substantially ineffective in magnetically saturating the remaining portion of said tube so that the total volume of said tube which is completely magnetically saturated varies in a controlled manner as a function of the position of said magnet means relative to said tube.

2. A sensing device as claimed in claim 1 further comprising a drive wire which is magnetically coupled to said sense wires.

3. A sensing device as claimed in claim 1 wherein said permanent magnet means comprises a pair of opposite magnetic poles positioned so that said adjacent portion of said tube is disposed intermediate said poles.

4. A sensing device comprising an elongated, hollow tube constructed of a material which is magnetically saturable, said tube having a longitudinal axis, first and second apertures in said tube, first and second pairs of sense wires that run in a direction generally parallel to the longitudinal axis of said tube with one end of each sense wire of a pair being interconnected within said tube to the other sense wire of the pair, a first electrical lead connected to the interconnected ends of said sense wires of said first pair of sense wires that passes through said first aperture, a second electrical lead connected to the interconnected ends of said sense wires of said second pair of sense wires that passes through said second aperture and elongated permanent magnet means constructed to completely magnetically saturate a portion of said tube which is disposed adjacent said magnet means and to be substantially ineffective in magnetically saturating the remaining portion of said tube so that the total volume of said tube which is completely magnetically saturated varies in a controlled manner as a function of the position of said magnet means relative to said tube.

5. A sensing device as claimed in claim 4 further comprising a drive wire which is magnetically coupled to said sense wires.

6. A sensing device as claimed in claim 4 wherein said permanent magnet means comprises a pair of opposite magnetic poles positioned so that said adjacent portion of said tube is disposed intermediate said poles.

7. A sensing device comprising first and second substantially parallel, elongated hollow tubes constructed of a material which is magnetically saturable, said tubes having longitudinal axes and a common section, a first pair of sense wires that run in a direction generally parallel to the longitudinal axes of said tubes with one end of each sense wire being interconnected, one wire of said first pair of sense wires passing through said first tube and the other wire of said first pair of sense wires passing through said second tube and elongated permanent magnet means constructed to completely magnetically saturate portions of said tubes which are disposed adjacent said magnet means and to be substantially ineffective in magnetically saturating the remaining portions of said tubes so that the total volume of said tubes which is completely magnetically saturated varies in a controlled manner as a function of the position of said magnet means relative to said tubes.

8. A sensing device as claimed in claim 7 further comprising a drive wire which is magnetically coupled to said sense wires.

9. A sensing device as claimed in claim 7 wherein said permanent magnet means comprises a pair of opposite magnetic poles positioned so that said adjacent portions of said tubes are disposed intermediate said poles.

10. A sensing device as claimed in claim 7 further comprising a second pair of sense wires that run in a direction generally parallel to the longitudinal axes of said tubes with one end of each sense wire being interconnected, one wire of said second pair of sense wires passing through said first tube and the other wire of said second pair of sense wires passing through said second tube with said sense wires of said first and second pair of sense wires being interconnected to form a four arm active bridge circuit element.

* * * * *